United States Patent
Kuhwald

(10) Patent No.: US 7,218,695 B2
(45) Date of Patent: May 15, 2007

(54) METHOD AND DEVICE FOR ACQUIRING AN ESTIMATED VALUE DEPENDENT ON THE MAXIMUM OF A SINGLE-FREQUENCY SIGNAL

(75) Inventor: Thomas Kuhwald, Dietramszell (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 908 days.

(21) Appl. No.: 10/278,102

(22) Filed: Oct. 21, 2002

(65) Prior Publication Data

US 2003/0099318 A1 May 29, 2003

(30) Foreign Application Priority Data

Nov. 28, 2001 (DE) .............................. 101 58 311

(51) Int. Cl.
*H04L 7/00* (2006.01)

(52) U.S. Cl. ...................... 375/355; 375/227; 375/334; 379/390; 379/388

(58) Field of Classification Search ................ 375/355, 375/227, 334; 379/390, 388
See application file for complete search history.

(56) References Cited

U.S. PATENT DOCUMENTS

| 5,721,754 A | 2/1998 | Chen |
| 6,842,516 B1 * | 1/2005 | Armbruster ............ 379/390.02 |
| 2004/0049383 A1 * | 3/2004 | Kato et al. ................. 704/226 |

\* cited by examiner

*Primary Examiner*—Chieh M. Fan
*Assistant Examiner*—Eva Zheng
(74) *Attorney, Agent, or Firm*—Christensen O'Connor Johnson Kindness PLLC

(57) ABSTRACT

The invention relates to a method and device for estimating an estimated value ($U^2_{max}$) dependent on the maximum ($U_{max}$) of a single-frequency signal sampled via a succession of sampled values (d(n)), wherein each of a predetermined number (N) of sampled values (d(n)) is squared and the predetermined number (N) of squared sampled values ($d^2(n)$) is summated.

5 Claims, 1 Drawing Sheet

METHOD AND DEVICE FOR ACQUIRING AN ESTIMATED VALUE DEPENDENT ON THE MAXIMUM OF A SINGLE-FREQUENCY SIGNAL

CROSS-REFERENCE TO RELATED APPLICATION

This applications claims priority benefit under 35 U.S.C. § 119 to German Patent Application No. 101 58 311.7, filed Nov. 28, 2001, which is incorporated herein by reference.

FIELD OF THE INVENTION

The invention relates to a method and a device for acquiring an estimated value dependent on the maximum of a single-frequency signal, as well as a computer program for executing the method.

BACKGROUND OF THE INVENTION

As is known, a digital signal is composed of a succession of sampled values. The sampled values, separated from one another in time by the sampling period, are situated at regular intervals along the operating course of the sampled continuous-time signal. Thus a sampled value will not necessarily be situated at the maximum of the sampled continuous-time signal. For a variety of applications, it is necessary to determine or estimate from the sampled sequence the maximum of the sampled continuous-time signal. One possible application, for example, is in an automatic gain control (AGC) in which a preamplifier arranged ahead of the analog/digital converter is switched on or off as a function of the level of the signal to be sampled, or is adjusted with respect to its gain factor. This procedure increases measuring dynamics and reduces quantification noise, by making better use of the range of values of the analog/digital converter. So that the preamplifier can be switched on or off, or adjusted, as a function of signal amplitude, the maximum of the sampled signal must be estimated. The method and device of the invention serve this purpose.

SUMMARY OF THE INVENTION

The left half of FIG. 1 shows, as a function of time t, a continuous-time signal u(t) which is sampled at time intervals $Ts=1/f_{sys}$. Signal u(t) is a single-frequency cosine signal having frequency $f_{ZF}$. The sampled values d(0) through d(5), inclusive, are shown. Continuous-time signal u(t) has the maximum $U_{max}$. The problem is to estimate the maximum $U_{max}$ with the greatest possible accuracy, on the basis of as few sampled values d(n) as possible. Hitherto such estimates of the maximum within a given time range have been produced by determining the greatest sampled value within a longer observation time period. But this procedure introduces an estimation error that depends on the phase position and frequency of signal u(t). If the signal u(t) to be evaluated is periodic, and if the ratio of the sampling frequency $f_{sys}$ to the repetition frequency $f_{ZF}$ of the signal u(t) to be evaluated is a rational number and an integer, the sampled values will repeat themselves after a certain observation time. In the example shown in FIG. 1, the sampling frequency $f_{sys}$ is four times the frequency $f_{ZF}$ of the signal u(t) to be evaluated. Thus only four different sampled values occur. The sampled value d(1) or d(5) will be detected as the greatest sampled value, but is less than the desired maximum $U_{max}$.

The situation is particularly adverse when the sampled values, as shown at the right of FIG. 1, occur symmetrically to the maximum $U_{max}$. With this phase position, the estimation error is particularly great when this known procedure is used. As is indicated in the right part of FIG. 1, the sampled values d(0) and d(1) may belong to different cosine functions having different amplitudes and frequencies. Nor does extending the observation period improve the accuracy of the estimation, if the ratio between the sampling frequency $f_{sys}$ and the (unknown) frequency $f_{ZF}$ of the signal u(t) to be evaluated is a rational integer.

The invention therefore has the object of creating a method and device, as well as a computer preprocessor, for estimating an estimated value dependent on the maximum of a single-frequency signal which is sampled via a succession of sampled values, and enabling a relatively accurate estimation of the maximum or of the estimated value dependent on the maximum, even when only a small number of sampled values are used.

This object is accomplished by the characteristics in Claim 1 with reference to the method, by the characteristics in Claim 6 with reference to the device, and by the characteristics in any one of Claims 12 through 14, inclusive, with reference to the computer program. The dependent Claims relate to advantageous developments of the invention.

The invention makes use of the discovery that assuming one is working with a single-frequency signal, the maximum can be calculated analytically using Parseval's Theorem. The estimation can then be performed via the use of a simple digital structure.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
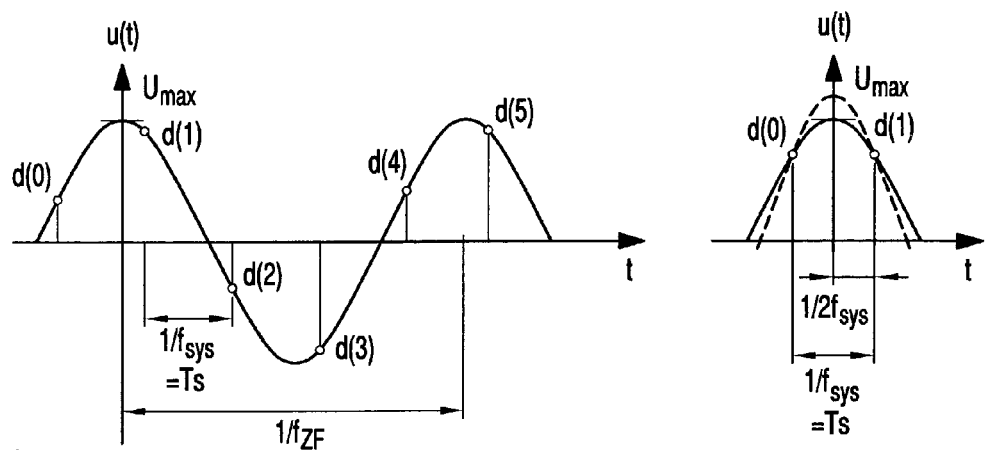
FIG. 1 shows a sampled single-frequency signal u(t) in order to elucidate the invention and the drawbacks of the background art.

While the preferred embodiment of the invention has been illustrated and described, it will be appreciated that various changes can be made therein without departing from the spirit and scope of the invention.

We first derive the formula of the invention for estimating the maximum on the basis of Parseval's Theorem. The method of the invention is suitable only for single-frequency signals u(t). Thus the invention is limited to cases in which the useful band contains only one frequency. According to Parseval's Theorem, which is described for example in Jürgen Göbel, "Kommunikationstechnik," ["Communications Engineering"] Hüthig-Verlag, ISBN 3-7785-3904-3, 1999, pages 31 to 32, the following relationship applies for any energy signal:

$$E = \int_{-\infty}^{\infty} |u(t)|^2 \, dt = \int_{-\infty}^{\infty} |U(f)|^2 \, df \quad (1)$$

where u(t) is the time signal, U(f) is the associated spectral function, and E describes the energy content of the signal. For discrete-time systems, Parseval's Theorem may be written as follows:

$$\frac{1}{N} \sum_{n=0}^{N-1} |d(n)|^2 = \sum_{\mu=0}^{N-1} |D(\mu)|^2 \quad (2)$$

where d(n) is the sampled values of time signal u(t) and D(μ) is the spectral lines of the associated discrete Fourier transform (DFT). For single-frequency (cosine-shaped) signals, the Fourier transform (FT) yields the following relationship:

$$u(t) = U_{max} \cos(2\pi f_{ZF} t) \xrightarrow{FT} U(f) = \frac{U_{max}}{2} [\delta(f - f_{ZF}) + \delta(f + f_{ZF})] \quad (3)$$

where δ(f) describes a Dirac pulse. In this case, the right side of equation (2) may be stated explicitly as follows:

$$\sum_{\mu=0}^{N-1} |D(\mu)|^2 = 2 \cdot \left(\frac{U_{max}}{2}\right)^2 = \frac{U_{max}^2}{2} \quad (4)$$

[and] by using this relationship in equation (2) one gets a formula for estimating the maximum $U_{max}$ from the succession of sampled values d(n) as follows:

$$U_{max} = \sqrt{\frac{2}{N} \sum_{n=0}^{N-1} |d(n)|^2} \quad (5)$$

Taking the root is relatively laborious. As a rule, it is not necessary to calculate the root. In many applications, what is desired is to estimate the maximum power of the signal u(t) to be evaluated, so that what is of interest is not the maximum of the level $U_{max}$, but rather its square. In other applications, appropriate control dynamics can take account of the fact that what is estimated is the square of the maximum, $U_{max}^2$, rather than the maximum of the level itself.

For estimating the maximum $U_{max}$ or the square of the maximum $U_{max}^2$, as the case may be, on the basis of formula (5), one needs only a very few sampled values d(n); consequently very rapid evaluation becomes possible. Because of the characteristics of the discrete Fourier transform (DFT), the estimation under the invention is accurate only if the following relationship exists with regard to the sampling frequency $f_{sys}$ and the (unknown) frequency $f_{ZF}$ of the signal u(t) to be studied:

$$\frac{N}{f_{sys}} = \frac{k}{2 f_{ZF}} \quad (6)$$

where k is an integer. If relationship (6) is not observed, an estimation error occurs that depends both on the starting phase of the signal u(t) to be studied and on that signal's frequency $f_{ZF}$.

Figure 3:
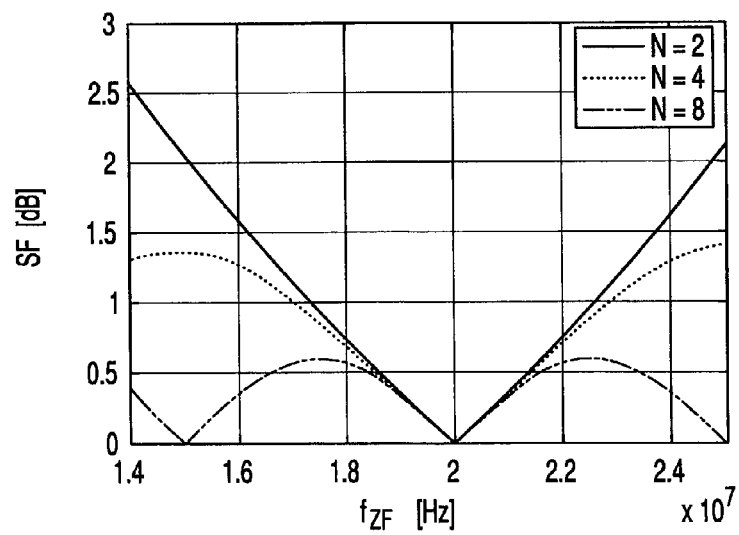
FIG. 3 shows the estimation error SF as a function of the frequency $f_{ZF}$ of the single-frequency signal u(t) to be evaluated.

FIG. 3 shows the estimation error SF in dB as a function of the frequency $f_{ZF}$ of the signal u(t) to be studied; in this case, the sampling frequency $f_{sys}$ is 80 MHz. The estimation error SF is represented for the cases where only two sampled values are used (N=2), as well as four sampled values (N=4) and eight sampled values (N=8). While the estimation error when only two sampled values are used is 2.6 dB in the worst case, the estimation error when eight sampled values are used is just 0.6 dB in the worst case, assuming the least favorable starting phase in each case. Thus it is sufficient in many applications to use merely two sampled values, and as a rule it will not be necessary to use more than eight sampled values.

Where it is sufficient to have an estimated result that is only proportional to the square of the maximum $U_{max}^2$, multiplication by the factor 2/N may be omitted. Multiplication is unnecessary anyway for N=2. If N is a power of the number 2, multiplication by the factor 2/N may be performed by way of a bit shift or a reinterpretation of the valiancy of the bits, so that this multiplication requires no implementation outlay.

Figure 2:
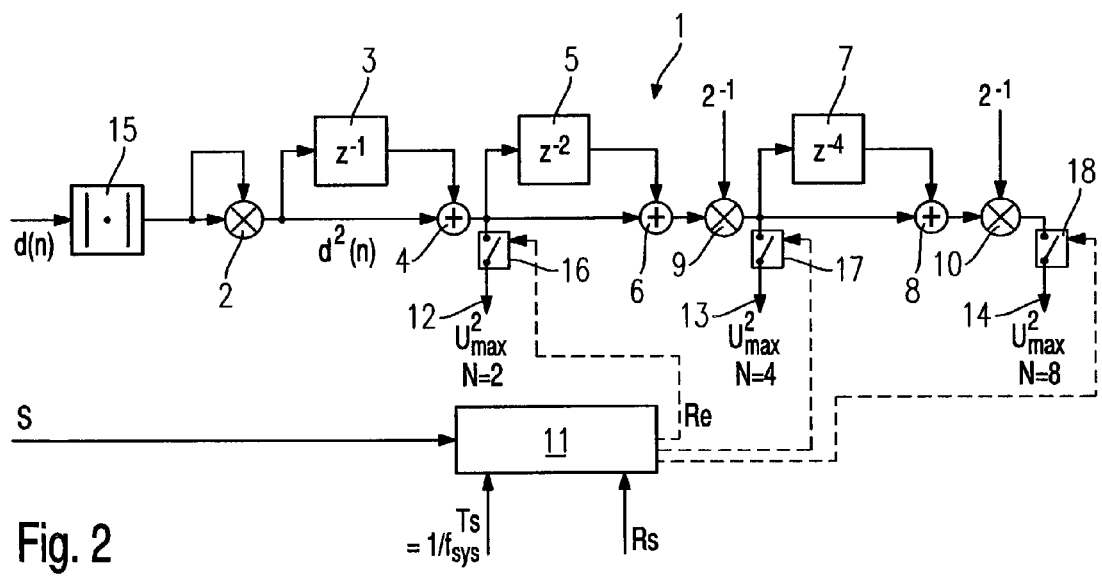
FIG. 2 shows an exemplary embodiment of a device for executing the method of the invention.

FIG. 2 shows an exemplary embodiment of a device 1 for executing the method of the invention. In the exemplary embodiment, the succession of input sampled values d(n) is conveyed to a multiplier 2 by way of an absolute-value generator 15. The absolute-value generator is shown for the represented exemplary embodiment only in order to provide a full analogy with formula (5). Since the square of a real number is always positive, regardless of the number's sign, the absolute-value generator 15 can of course also be omitted, and the succession of input sampled values d(n) may be conveyed directly to the multiplier 2. In the multiplier 2, the input sampled values d(n) are multiplied by themselves, thus generating the squares $d^2(n)$ of the sampled values, which in turn are conveyed to a first input of a first summing amplifier 4. Furthermore, a first time-delay element 3 is present that delays each of the output values from the multiplier 2 by one clock unit Ts. The delayed, squared sampled values are conveyed to a second input of first summing amplifier 4, so that first summing amplifier 4 summates the output values from multiplier 2 and first time-delay element 3. These components are already sufficient for a first, simple exemplary embodiment that makes allowance for only two input sampled values at a time (N=2). The estimated square of the maximum $U_{max}^2$ is available at a first output 12. Since the factor 2/N equals 1 for N=2, this factor need not be taken into account for N=2.

Ahead of the first output 12, a first controllable switching element 16 may be present, actuated by a counter 11. Counter 11 receives a start signal S from a sequence controller (not shown). Prior to each counting operation, counter 11 must be reset by a reset signal Rs. Furthermore, the sampling frequency $f_{sys}$ is also conveyed to counter 11. Counter 11 counts the sampling periods Ts. After counter 11 has received the start signal S, counter 11 enables first output 12 after two sampling periods 2·Ts via a first controllable switching element 16.

The exemplary embodiment of a device 1 for executing the method of the invention, as shown in FIG. 2, has additional outputs 13 and 14, at which is available the square of the maximum $U_{max}^2$, calculated with greater accuracy on the basis of four input sampled values (N=4) or eight input sampled values (N=8).

For this purpose the output from the first summing amplifier 4 is connected directly, on the one hand, to a first input of a second summing amplifier 6, and indirectly, on the other hand, to a second input of the second summing amplifier 6 via a second time-delay element 5. Second time-delay element 5 delays each of the output values from first summing amplifier 4 by two sampling periods 2·Ts. Thus each time after two successive squared sampled values $d^2(n)$ have been summated in first summing amplifier 4, second summing amplifier 6 summates a total of four successive squared sampled values $d^2(n)$ at a time. For N=4, the factor 2/N is equal to ½ in estimation formula (5). This is illustrated in FIG. 2 by way of a multiplier which is connected after second summing amplifier 6 and performs a multiplication by a factor of ½. In actual implementation, however, this procedure is preferably not performed by a multiplier, but rather by a first bit shifter 9, which reduces the valiancy of each of the bits in the output words from second summing amplifier 6 by one place. In place of a genuine bit shift, the result from second summing amplifier 6 may also be reinterpreted in a simplified manner by interpreting the places in the output words from second summing amplifier 6 by reducing their valiancy by one place. Thus no hardware outlay is required for bit shifter 9.

The squared maximum $U_{max}^2$ estimated for N=4 is available at the output from bit shifter 9. Before second output 13, provision may be made for a second controllable switching element 17, which is enabled by counter 11 after counter 11 has counted four sampling periods 4·Ts since receiving the start signal S.

Accordingly, in the exemplary embodiment shown in FIG. 2, provision is made for a third summing amplifier 8 whose first input is connected directly to the output of second summing amplifier 6 via bit shifter 9, and indirectly to the output of second summing amplifier 6 via a third time-delay element 7 via bit shifter 9. In third time-delay element 7, the output values from second summing amplifier 6 or from bit shifter 9, as the case may be, are each delayed by four sampling periods 4·Ts. Thus in all, summing amplifier 8 summates eight successive squared sampled values $d^2(n)$.

For N=8, factor 2/N in estimation formula (5) is ¼. After bit shifter 9 has already performed a multiplication by the factor ½, a second bit shifter 10 must correct for the remaining factor ½. Here again, in place of a true bit shifter 10 one may perform an appropriate reinterpretation of the valiancy of the bits in the output words of third summing amplifier 8. The squared maximum $U_{max}^2$ for N=8 is available at third output 14. Ahead of third output 14, provision may be made for a third controllable switching element 18 enabled by counter 11 after counter 11 has counted eight sampling periods 8·Ts since receiving the start signal S.

Triggering via counter 11 is necessary only when one has a succession of sampled values d(n) that is not valid until a start signal S is present. To the extent that one can assume that at least eight valid sampled values will be available, even if only shortly before the start signal is received, outputs 12 through 14 may be enabled immediately after the start signal S is received.

In contrast to the observation commonly found to date in the field of timing, the method of the invention has the advantage of needing only a very few sampled values for the estimation—as a rule no more than eight—and thus not needing a more extended observation interval. Thus, for example in an automatic gain control (AGC), one can achieve very quick response by switching the preamplifier on or off, or by adjusting the preamplifier.

The embodiments of the invention in which an exclusive property or privilege is claimed are defined as follows:

1. A device for estimating a maximum value of a single-frequency signal sampled via a succession of sampled values, having a multiplier that multiplies the input sampled values times themselves, a first time-delay element that delays the output values from the multiplier by one sampling period, a first summing amplifier that summates the output values from the multiplier and the first time-delay element, a second time delay element that delays the output values from the first summing amplifier by two sampling periods, and a second summing amplifier that summates the output values from the first summing amplifier and the second time-delay element.

2. The device of claim 1, characterized by a third time-delay element that delays the output values from the second summing amplifier by four sampling periods, and a third summing amplifier that summates the output values from the second summing amplifier and the third time-delay element.

3. The device of claim 1, characterized by a first bit shifter that is arranged after the second summing amplifier and reduces the valiancy of the bits for the output values from the second summing amplifier by one place.

4. The device of claim 2, characterized by a second bit shifter that is arranged after the third summing amplifier and reduces the valiancy of the bits for the output values from the third summing amplifier by one place.

5. A device for estimating a maximum value of a single-frequency signal sampled via a succession of sampled values, the device comprising:

a multiplier that multiplies the input sampled values times themselves, a first time-delay element that delays the output values from the multiplier by one sampling period, a first summing amplifier that summates the output values from the multiplier and the first time delay element, and a counter that counts the sampling periods for the succession of input sampled values and enables an output following the first summing amplifier after 2 sampling periods and/or enables an output following a second summing amplifier after 4 sampling periods, and/or enables an output following a third summing amplifier after 8 sampling periods.

* * * * *

UNITED STATES PATENT AND TRADEMARK OFFICE
CERTIFICATE OF CORRECTION

PATENT NO. : 7,218,695 B2 Page 1 of 1
APPLICATION NO. : 10/278102
DATED : May 15, 2007
INVENTOR(S) : T. Kuhwald It is certified that error appears in the above-identified patent and that said Letters Patent is hereby corrected as shown below:

| COLUMN | LINE | ERROR |
|---|---|---|
| 6 (Claim 1, | 23 line 10) | "time delay" should read --time-delay-- |
| 6 (Claim 5, | 56 line 9) | "time delay" should read --time-delay-- |

Signed and Sealed this

Fourteenth Day of August, 2007

JON W. DUDAS
*Director of the United States Patent and Trademark Office*